(12) United States Patent
Paige et al.

(10) Patent No.: US 12,693,334 B1
(45) Date of Patent: Jul. 28, 2026

(54) PORTABLE MOTOR TESTING DEVICE AND ASSOCIATED METHODS OF DETERMINING MOTOR HEALTH USING A PLURALITY OF SPEED RAMPS

(71) Applicant: Amazon Technologies, Inc., Seattle, WA (US)

(72) Inventors: Ethan Paige, Franklin, MA (US); Wonjae Jang, Westborough, MA (US); Awadhesh Kumar Thakur, Upton, MA (US); Peter Michael Groudas, Plaistow, NH (US)

(73) Assignee: Amazon Technologies, Inc., Seattle, WA (US)

( * ) Notice: Subject to any disclaimer, the term of this patent is extended or adjusted under 35 U.S.C. 154(b) by 177 days.

(21) Appl. No.: 18/616,825

(22) Filed: Mar. 26, 2024

(51) Int. Cl.
    G01R 31/34 (2020.01)
    G01R 1/02 (2006.01)

(52) U.S. Cl.
    CPC .......... G01R 31/343 (2013.01); G01R 1/025 (2013.01)

(58) Field of Classification Search
    CPC ........ H02K 11/33; H02K 7/003; H02K 11/27; H02P 29/00; H02P 6/08; H02P 5/74; H02P 6/16; H02P 6/22; H02P 6/28; H02P 6/30; H01R 12/7088; G01R 31/343; G01R 1/025; G06F 18/20; G06F 18/217; G06F 3/1279
    See application file for complete search history.

(56) References Cited

U.S. PATENT DOCUMENTS

| | | | | | |
|---|---|---|---|---|---|
| 5,530,343 | A | * | 6/1996 | Bowers, III | G01P 3/48 324/160 |
| 5,739,698 | A | * | 4/1998 | Bowers | H02P 29/024 324/545 |
| 6,236,947 | B1 | * | 5/2001 | Dowling | G01R 31/343 324/750.16 |
| 7,538,571 | B2 | * | 5/2009 | Raichle | G01R 31/343 324/765.01 |
| 9,255,969 | B2 | * | 2/2016 | Basu | G01R 31/343 |
| 9,766,270 | B2 | * | 9/2017 | Heydron | G01R 15/12 |
| 10,840,777 | B2 | * | 11/2020 | Coonrod | H02K 11/20 |
| 11,268,979 | B2 | * | 3/2022 | Gervedink Nijhuis | G01R 31/343 |
| 12,072,382 | B2 | * | 8/2024 | Al Zahrani | G01R 31/34 |

* cited by examiner

*Primary Examiner* — Vinh P Nguyen
(74) *Attorney, Agent, or Firm* — Athorus, PLLC

(57) ABSTRACT

Portable, handheld motor testing devices may be used to test and diagnose faults experienced by motors while they are still installed or assembled in various machinery or equipment. The handheld devices may comprise power supplies, user interfaces, microcontrollers, motor driver boards, and replaceable or swappable cables. In addition, the handheld devices may be configured to connect to and safely and reliably test various different types of motors, including closed box motors having generally unknown structural, internal, or operational characteristics, using various combinations or sequences of motor testing algorithms.

19 Claims, 6 Drawing Sheets

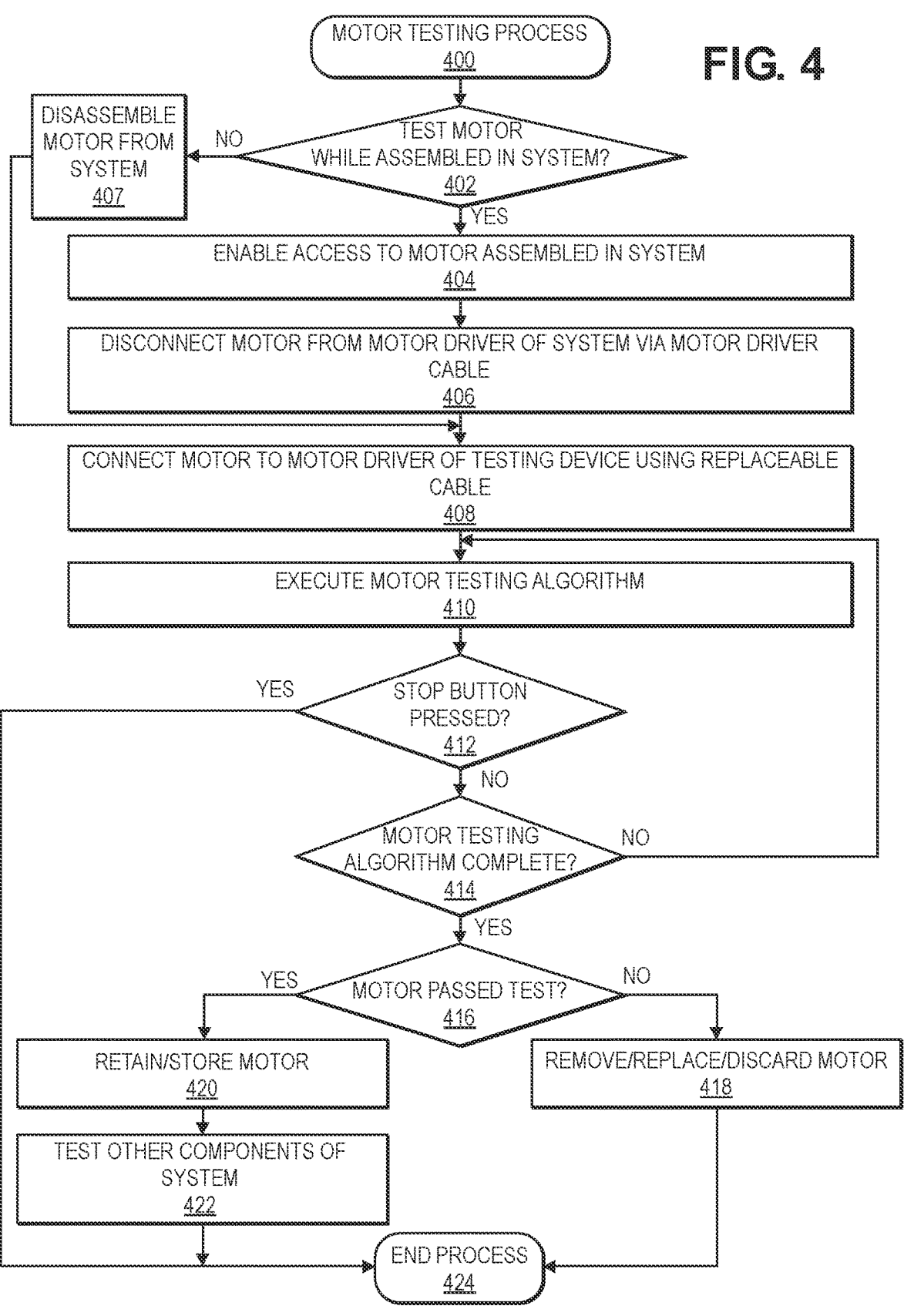

FIG. 4

MOTOR TESTING PROCESS
400

TEST MOTOR WHILE ASSEMBLED IN SYSTEM?
402

NO → DISASSEMBLE MOTOR FROM SYSTEM 407

YES

ENABLE ACCESS TO MOTOR ASSEMBLED IN SYSTEM
404

DISCONNECT MOTOR FROM MOTOR DRIVER OF SYSTEM VIA MOTOR DRIVER CABLE
406

CONNECT MOTOR TO MOTOR DRIVER OF TESTING DEVICE USING REPLACEABLE CABLE
408

EXECUTE MOTOR TESTING ALGORITHM
410

STOP BUTTON PRESSED?
412

YES

NO

MOTOR TESTING ALGORITHM COMPLETE?
414

NO

YES

MOTOR PASSED TEST?
416

YES

NO

RETAIN/STORE MOTOR
420

REMOVE/REPLACE/DISCARD MOTOR
418

TEST OTHER COMPONENTS OF SYSTEM
422

END PROCESS
424

PORTABLE MOTOR TESTING DEVICE AND ASSOCIATED METHODS OF DETERMINING MOTOR HEALTH USING A PLURALITY OF SPEED RAMPS

BACKGROUND

Various machinery, equipment, or other systems may utilize various types of motors. For example, various material handling processes within a material handling facility may utilize various machinery, equipment, systems, robotic devices, drive units, or other robotic or automated devices that may include various types of motors. When such machinery, equipment, or systems experience faults or failures, shutdown and/or removal of the machinery, equipment, or systems from operation, as well as disassembly of various assemblies, subassemblies, or components including motors, may be required in order to test, diagnose, and correct such faults. Further, conventional testing or maintenance systems that are used to test, diagnose, and correct such faults may be large, fixed, and dedicated testing stations or equipment. Thus, significant operational downtime and costs may be associated with conventional testing systems that test, diagnose, and correct faults associated with motors utilized in various machinery, equipment, or devices. Accordingly, there is a need for portable, efficient, and reliable testing devices to accurately test and diagnose faults associated with motors, while reducing the downtime, costs, and labor associated with conventional fixed, dedicated testing systems.

BRIEF DESCRIPTION OF THE DRAWINGS

FIG. 4 is a flow diagram illustrating an example motor testing process, in accordance with implementations of the present disclosure.

DETAILED DESCRIPTION

Figure 1:
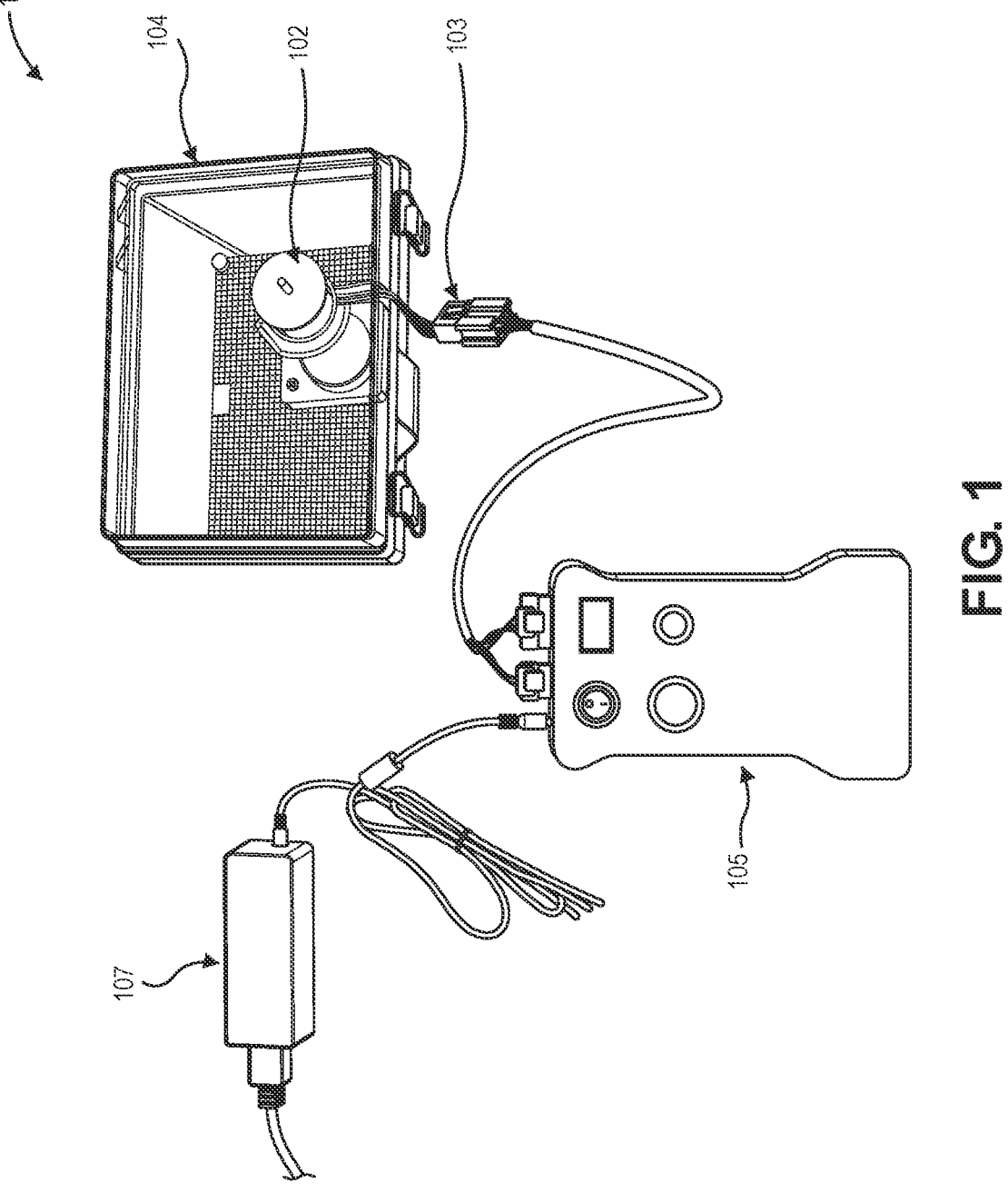
FIG. 1 is a schematic diagram of an example portable motor testing device and a motor under test, in accordance with implementations of the present disclosure.

As is set forth in greater detail below, implementations of the present disclosure are directed to portable, handheld testing devices or units to accurately and reliably test and diagnose faults or failures associated with motors, while reducing the downtime, costs, and labor that are associated with conventional large, fixed, and dedicated testing systems or workstations.

In example embodiments, in comparison with conventional large, fixed, and dedicated testing stations or workstations, the example portable, handheld testing devices described herein may be relatively lower cost, lighter weight, and more flexible or adaptable to testing various types of motors, including closed box motors which may refer to motors for which internal, structural, or operational characteristics are generally unknown. In addition, by using the example portable, handheld testing devices described herein, downtime, labor, and other costs associated with testing and diagnosing motor faults or failures may be reduced. Further, the example portable, handheld testing devices described herein may enable independent and definitive determinations of health or functionality of various types of motors.

In further example embodiments, the example portable, handheld testing devices may be used to test or diagnose motors that remain assembled or installed in various machinery, equipment, or systems within which such motors are designed to operate. In other examples, the example portable, handheld testing devices may be used to test or diagnose motors that have been disassembled or removed from various machinery, equipment, or systems. In either case, the example portable, handheld testing devices described herein may enable independent and definitive determinations of health or functionality of various types of motors, independently of any faults or failures that may be associated with or experienced by other components of the various machinery, equipment, or systems.

In additional example embodiments, in order to use the portable, handheld testing devices to test various types of motors, various replaceable, swappable, or disposable cables may comprise different connectors that are configured to connect or couple with various different types of motors. For example, first connectors at first ends of the replaceable or swappable cables may be the same for all cables, and may be configured to couple to one or more connectors of the portable testing device and various internal components thereof, as further described herein. In addition, second connectors at second ends of the replaceable or swappable cables may be different between or among substantially all cables, and may be configured to couple to respective different motor connectors of respective different motors. In some examples, the various types of motors may comprise brushless direct current (BLDC) motors, direct current (DC) motors, stepper motors, servo motors, or other types of motors.

In example embodiments, various types of testing algorithms may be executed to test or diagnose health or functionality of various types of motors. Some example testing algorithms may include one or more commanded speeds or speed ramps, one or more associated time durations, and/or other types, combinations, or sequences of motor inputs or commands. In addition, the motor outputs or parameters in response to such motor inputs or commands may be compared against nominal values or ranges associated with known functional or healthy motors of the same or similar types. The motor outputs or parameters may comprise values associated with current, voltage, rotational speed, torque, power consumption, temperature, and/or other motor parameters.

In further example embodiments, the example portable, handheld testing devices and associated testing algorithms may be used to test or diagnose closed box motors for which internal, structural, or operational characteristics are generally unknown. For example, by testing and measuring operational characteristics of known functional or healthy motors of the same or similar types, expected operational characteristics of closed box motors may be predicted or estimated, and such closed box motors may be tested or diagnosed for faults or failures without full, complete, or substantially any knowledge of internal or structural characteristics. In still further examples, internal or structural characteristics of closed box motors may be estimated using various parameter estimation, model-based or data-based design or analysis, or other identification techniques based on data related to motor inputs, commands, outputs, or parameters of closed box motors, data related to motor inputs, command, outputs, or parameters of known functional or healthy motors, and/or data related to known or estimated internal or structural characteristics of known functional or healthy motors.

FIG. 1 is a schematic diagram 100 of an example portable motor testing device and a motor under test, in accordance with implementations of the present disclosure.

As shown in FIG. 1, the example portable motor testing device 105 may comprise a housing, a user interface, a microcontroller, a motor driver board, and/or other components. In addition, the portable motor testing device 105 may comprise or couple with a power supply 107. Further, the portable motor testing device 105 may couple with a motor under test 102 via a replaceable, swappable, or disposable cable.

In example embodiments, the portable motor testing device or unit 105 may be sized to be handheld and/or carried by an agent or operator, e.g., a human agent. The user interface may comprise a power switch or button, a start test button, a stop test button, a display, and/or other components. The microcontroller may comprise one or more processors, memories, input/output interfaces, communication devices or connections, or other electrical components. In addition, the microcontroller may be configured to determine, send, or transmit motor inputs or commands to the motor under test 102 via the motor driver board, and the microcontroller may be configured to receive, measure, or process motor outputs or parameters from the motor under test 102 via the motor driver board. The motor driver board may be configured to send or instruct motor inputs or commands based on instructions or inputs from the microcontroller, and the motor driver board may be configured to receive or measure, in response to the motor inputs or commands, motor outputs or parameters to be processed by the microcontroller. Further details of the portable motor testing device or unit 105 are described herein at least with respect to FIGS. 2A and 2B.

In some example embodiments, the power supply 107 may comprise an external power supply and/or adapter, e.g., that transfers or transmits power from an external power source to various components of the portable motor testing device 105. In other example embodiments, the power supply 107 may comprise an internal power supply, such as one or more batteries or other portable power supplies, e.g., that provide power to various components of the portable motor testing device 105. Further details of the power supply 107 and example connections are described herein at least with respect to FIGS. 2A and 2B.

Furthermore, the motor under test 102 may comprise various types of motors, such as brushless direct current (BLDC) motors, direct current (DC) motors, stepper motors, servo motors, or other types of motors. The motor under test 102 may comprise a data and/or power communication cable with a motor connector 103 at an end thereof. The portable motor testing device 105 may couple or connect with the motor under test 102 via a replaceable, swappable, or disposable cable having an associated connector that mates with the motor connector 103 of the motor under test 102. Further details of example replaceable, swappable, or disposable cables having associated motor connectors are described herein at least with respect to FIGS. 2A and 2B.

In some example embodiments, the motor under test 102 may be disassembled or removed from machinery, equipment, or other systems within which the motor under test 102 is designed to operate. For example, the machinery, equipment, or other systems may comprise various material handling equipment, sortation systems, conveyance machinery, robotic drive units, shuttles, other robotic or automated vehicles, or other types of robotic, automated, semi-automated, or electromechanical systems or devices. As shown in FIG. 1, the motor under test 102 may be removed from a system within which it is designed to operate, and may be placed within a test housing, fixture, or container 104 during testing processes with the portable motor testing device 105.

In further example embodiments, the motor under test 102 may remain assembled or installed within various machinery, equipment, or other systems within which the motor under test 102 is designed to operate. For example, the motor connector 103 of the motor under test 102 may be decoupled or disconnected from a motor driver board, microcontroller, or other components within the machinery, equipment, or system within which the motor under test 102 is assembled or installed, and the motor connector 103 may be coupled with a mating connector of the portable motor testing device 105 via a replaceable, swappable, or disposable cable.

By enabling testing of a motor under test 102 while still assembled or installed within various machinery, equipment, or other systems, the portable motor testing device 105 may reduce the downtime, costs, and labor associated with testing or diagnosing faults or failures of motors using conventional large, fixed, and dedicated testing workstations that require disassembly and/or removal of devices or motors from the various machinery, equipment, or systems. In addition, the motor under test 102 may be tested by the portable motor testing device 105 independently of other electrical components of the various machinery, equipment, or other systems, which may also isolate or protect such other electrical components from potential damage or faults that may be inadvertently caused during motor testing processes.

Figures 2A, 2B:
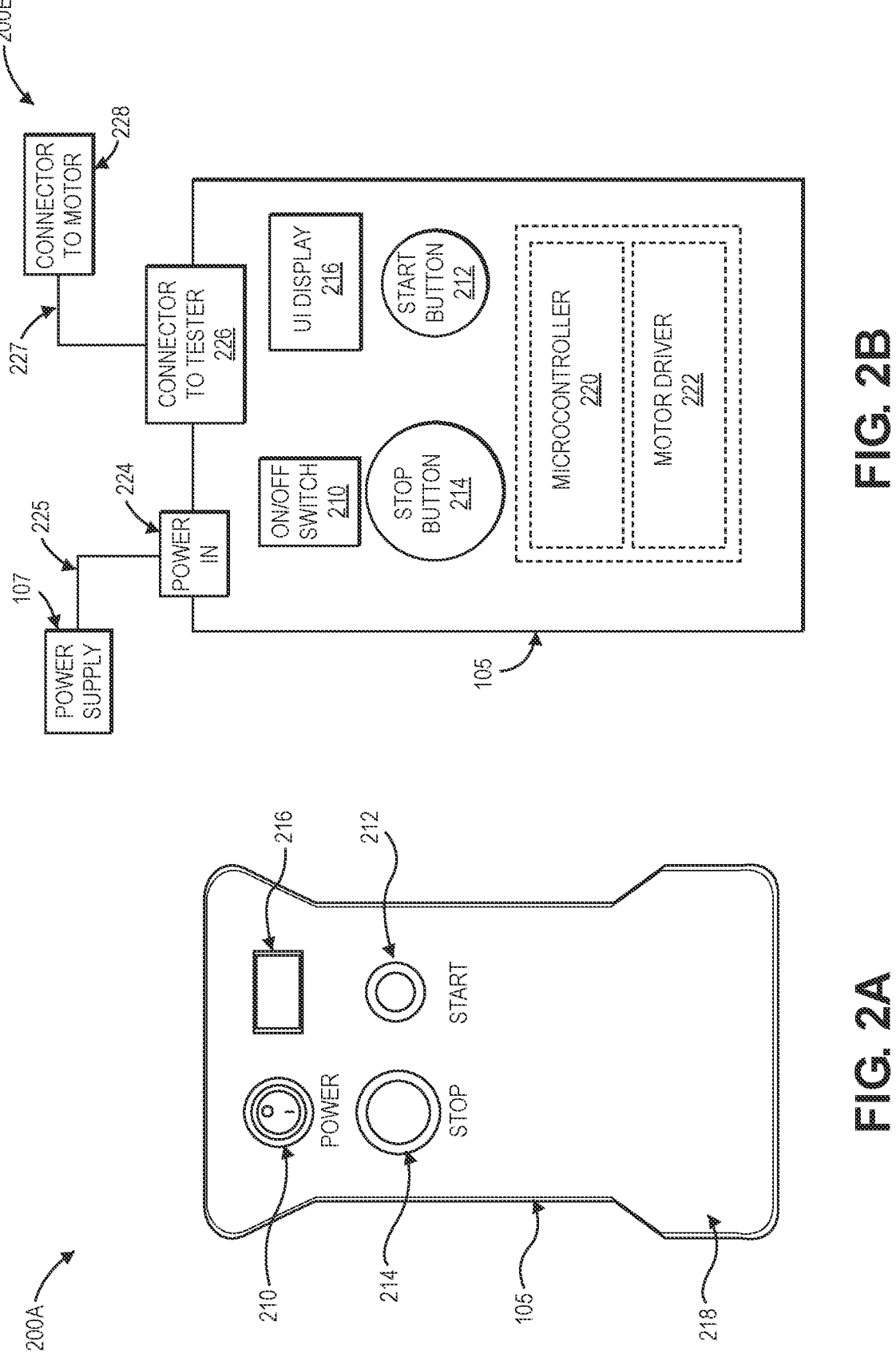
FIG. 2A is a schematic, front view diagram of an example portable motor testing device, in accordance with implementations of the present disclosure.
FIG. 2B is a schematic diagram of example components and connections associated with a portable motor testing device, in accordance with implementations of the present disclosure.

FIG. 2A is a schematic, front view diagram 200A of an example portable motor testing device, in accordance with implementations of the present disclosure, and FIG. 2B is a schematic diagram 200B of example components and connections associated with a portable motor testing device, in accordance with implementations of the present disclosure.

As shown in FIGS. 2A and 2B, an example portable motor testing device 105 may comprise a housing 218, a power switch or button 210, a start test button 212, a stop test button 214, a display 216, and/or other components.

The housing 218 may comprise a handheld, portable, and/or ergonomic size or shape that may be held or carried in one hand by an agent or operator, e.g., a human agent. The housing 218 may enclose or surround various internal components, including portions of the power switch or button 210, the start test button 212, the stop test button 214, the display 216, and/or other components such as a microcontroller 220, motor driver board 222, and/or various other data, power, or electrical components or connectors. In addition, the housing 218 may be formed of various materials, such as plastics, metals, composites, other materials, or combinations thereof.

The power switch 210 may comprise a switch, button, or other input element via which power may be supplied or removed from various components of the portable motor testing device 105. As described herein, power may be supplied from an external and/or internal power supply or source, and the power switch 210 may be actuated to turn on or provide power to the various components of the device 105, or to turn off or remove power from the various components of the device 105.

In example embodiments utilizing external power sources or supplies, the housing 218 may also comprise a power in 224 connector via which a power transfer cable or wire 225 may be coupled or connected to the device 105. The power transfer cable 225 may be coupled between the power supply 107 and the power in 224 connector to provide power to the device 105 from an external power source or supply.

The start test button 212 may comprise a switch, button, or other input element via which a motor testing algorithm may be initiated. For example, responsive to actuation of the start test button 212, operations of the microcontroller and/or motor driver board may be initiated to begin a motor testing process for a connected motor under test, as further described herein.

The stop test button 214 may also comprise a switch, button, or other input element via which a motor testing algorithm may be terminated. For example, responsive to actuation of the stop test button 214, operations of the microcontroller and/or motor driver board may be terminated to end a motor testing process for a connected motor under test, as further described herein.

The display 216 may comprise a screen, monitor, liquid crystal display, or other types of visual output devices to provide visual feedback, data, or information related to the motor testing device 105. For example, the display 216 may be configured to provide or present an indication of power, e.g., turned on or turned off. In addition, the display 216 may be configured to provide or present an indication of start or initiation of a motor testing process, current progress of a motor testing process, and/or an indication of end or termination of a motor testing process. Further, the display 216 may be configured to provide or present an indication of a motor health or functionality following completion or termination of a motor testing process, e.g., good, bad, pass, fail, green light, red light, etc., as well as various motor inputs, outputs, parameters, or other information, identified faults and/or trends over time, and/or recommended corrective actions or other diagnostic insights.

In further example embodiments, the display 216 may be configured to provide or present data or information related to particular motor outputs or parameters related to motor health or functionality following completion or termination of a motor testing process, e.g., values related to current, voltage, rotational speed, torque, power consumption, temperature, and/or other motor parameters. In other example embodiments, one or more other data connections or connectors may be associated with the housing 105, e.g., universal serial bus connections or other data transfer connections, in order to transfer various data or information related to motor health or functionality from the device 105 to one or more other computers, computing devices, or remote computing resources. The other computers or computing resources may be configured to perform additional or more complex processing and/or analysis of the data related to motor health or functionality.

The user interface of the portable motor testing device 105 may also comprise one or more additional control buttons or input elements, such as buttons, keys, toggles, switches, touchpads, touchscreens, or other input elements. The input elements may be configured to enable a user to select testing or diagnostic software, programs, or routines, modify or adjust inputs, outputs, or other parameters, start, stop, or pause testing processes, and/or otherwise interact with and modify the testing processes and associated software, programs, or routines.

The microcontroller 220 may comprise one or more processors, memories, input/output interfaces, communication devices or connections, or other electrical components. The microcontroller 220 may be programmed or designed with instructions, commands, and/or software associated with one or more motor testing processes or algorithms, in order to test or diagnose faults or failures of one or more types of motors. In addition, the microcontroller 220 may be configured to determine, send, or transmit motor inputs or commands to test a motor under test via the motor driver board 222, e.g., responsive to initiation of a motor test process by actuation of the start test button 212. For example, the motor inputs or commands from the microcontroller 220 may comprise rotational speed inputs, time durations, time delays, or other commands or instructions. Further, the microcontroller 220 may be configured to determine, send, or transmit motor inputs or commands to stop testing of a motor under test via the motor driver board 222, e.g., responsive to termination of a motor test process by actuation of the stop test button 214. Moreover, the microcontroller 220 may be configured to receive, measure, or process motor outputs or parameters from the motor under test via the motor driver board 222 upon stopping or completion of the motor testing process. In some examples, the microcontroller 220 may comprise one or more hardware, software, algorithms, models, or other applications configured to implement or execute parameter estimation techniques and/or model-based or data-based analysis of motor parameters and data, as further described herein.

The motor driver board 222 may also comprise one or more processors, memories, input/output interfaces, communication devices or connections, or other electrical components. The motor driver board 222 may be configured to send or instruct motor inputs or commands based on instructions or inputs from the microcontroller 220, e.g., using open-loop or closed-loop motor control techniques or processes. For example, the motor inputs or commands from the motor driver board 222 may comprise instructions or commands related to current, voltage, rotational speed, or other operational characteristics of the motor under test. In addition, the motor driver board 222 may be configured to receive or measure, in response to the motor inputs or commands, motor outputs or parameters to be processed by the microcontroller 220. For example, the motor outputs or parameters may comprise values related to current, voltage, rotational speed, torque, power consumption, temperature, or other operational characteristics of the motor under test.

In addition, a power control board may be associated with the microcontroller 220 and/or the motor driver board 222, and the power control board may be configured to provide configurable power, e.g., desired levels of voltage and/or current, to ensure compatibility to test and diagnose various types of motors. Further, dedicated hardware and/or software to implement or execute parameter estimation algorithms or techniques and/or model-based or data-based analysis may be associated with the microcontroller 220 and/or the motor driver board 222, and such hardware and/or software may receive, store, and/or process various motor inputs, outputs, or other parameters, e.g., voltage, current, torque, speed, or others. Using such data from motor testing processes, the dedicated hardware and/or software may perform or execute parameter estimation of tested motors and also implement data-based modeling of the tested motors.

In some example embodiments, the microcontroller 220 and the motor driver board 222 may comprise two separate or distinct components, circuit boards, or printed circuit board assemblies (PCBAs) that are positioned or enclosed within the housing 218. The microcontroller 220 and the motor driver board 222 may be connected or coupled with each other to communicate data and information therebetween. For example, the microcontroller 220 may transmit motor inputs or commands to the motor driver board 222 for a motor testing process or algorithm, and the motor driver board 222 may, responsive to the commands from the microcontroller 220, transmit motor inputs or commands to the motor under test. In addition, the motor driver board 222 may measure or detect motor outputs or parameters during and/or after a motor testing process or algorithm, and the motor driver board 222 may transmit the motor outputs or parameters to the microcontroller 220, e.g., for processing and/or analysis of the motor outputs.

In other example embodiments, the microcontroller 220 and the motor driver board 222 may be combined or integrated into a single unit, component, circuit board, or printed circuit board assembly (PCBA) that is positioned or enclosed within the housing 218. In such embodiments, the functions or operations of the microcontroller 220 and the motor driver board 222 may be combined or integrated within the single unit. In this manner, the combined or integrated microcontroller 220/motor driver board 222 may transmit motor inputs or commands for a motor testing process or algorithm to a motor under test. In addition, the combined or integrated microcontroller 220/motor driver board 222 may measure or detect motor outputs or parameters during and/or after a motor testing process or algorithm, and also may perform processing and/or analysis of the motor outputs or parameters.

In additional example embodiments, the microcontroller 220, motor driver board 222, and/or other components of the device 105 may comprise various noise protection features, filters, diodes, and/or other components, in order to enable reliable and accurate operation of the device 105, e.g., in electrically, electromagnetically, and/or radio frequency (RF) noisy environments. In addition, the microcontroller 220, motor driver board 222, power in 224 connector, power supply 107, and/or other components of the device 105 may comprise various power filtering or protection components to ensure safe and reliable operation of the device 105.

In example embodiments, the housing 218 may also comprise one or more replaceable, swappable, and/or disposable cables or wires 227 that may be coupled or connected between the device 105 and one or more motors under test, e.g., various types of motors. At first ends of the replaceable wires 227, one or more connectors to tester 226 may be coupled to the replaceable wires 227, and the connectors to tester 226 may be configured to operatively electrically connect the replaceable wires 227 with one or more connectors of the portable motor testing device 105. The connectors to tester 226 may be substantially the same or identical for each of the one or more replaceable wires 227, such that each replaceable wire 227 may be operatively connected to the testing device 105.

At second ends of the replaceable wires 227, one or more connectors to motor 228 may be coupled to the replaceable wires 227, and the connectors to motor 228 may be configured to operatively electrically connect the replaceable wires 227 with one or more connectors of respective motors under test, e.g., such as the motor connector 103 shown in FIG. 1. In contrast with the connectors to tester 226, the connectors to motor 228 may be different or unique among or between the one or more replaceable wires 227, such that each replaceable wire 227 may be operatively connected to a different respective motor under test.

By providing and/or utilizing a plurality of replaceable wires 227 having the same first connectors to tester 226 at first ends and also having different second connectors to motor 228 at second ends, the portable motor testing device 105 may be used to test or diagnose multiple different motors or motor types by simply replacing or swapping the replaceable wires 227 that can operatively connect or couple with the multiple different motors or motor types.

In additional example embodiments, the one or more replaceable wires 227 may be configured to send or transmit various data or information, including phase information, hall effect sensor data, and/or other data or information related to motor inputs or commands, as well as motor outputs or parameters. Various other types of data or information may also be transmitted or sent between the portable motor testing device 105 and various motors under test via the replaceable wires 227 and associated connectors 226, 228.

In further example embodiments, the one or more replaceable wires 227 may be designed or configured to act as failure points relative to electrical pins, connections, or connectors between the device 105 and motors under test. In this manner, when a replaceable wire 227 or associated connectors 226, 228 has failed or been damaged, the replaceable wire 227 and associated connectors 226, 228 may be more quickly, easily, and efficiently replaced, while also preventing damage or failure to the portable motor testing device 105 and/or the various motors under test and their associated connectors.

Figure 3:
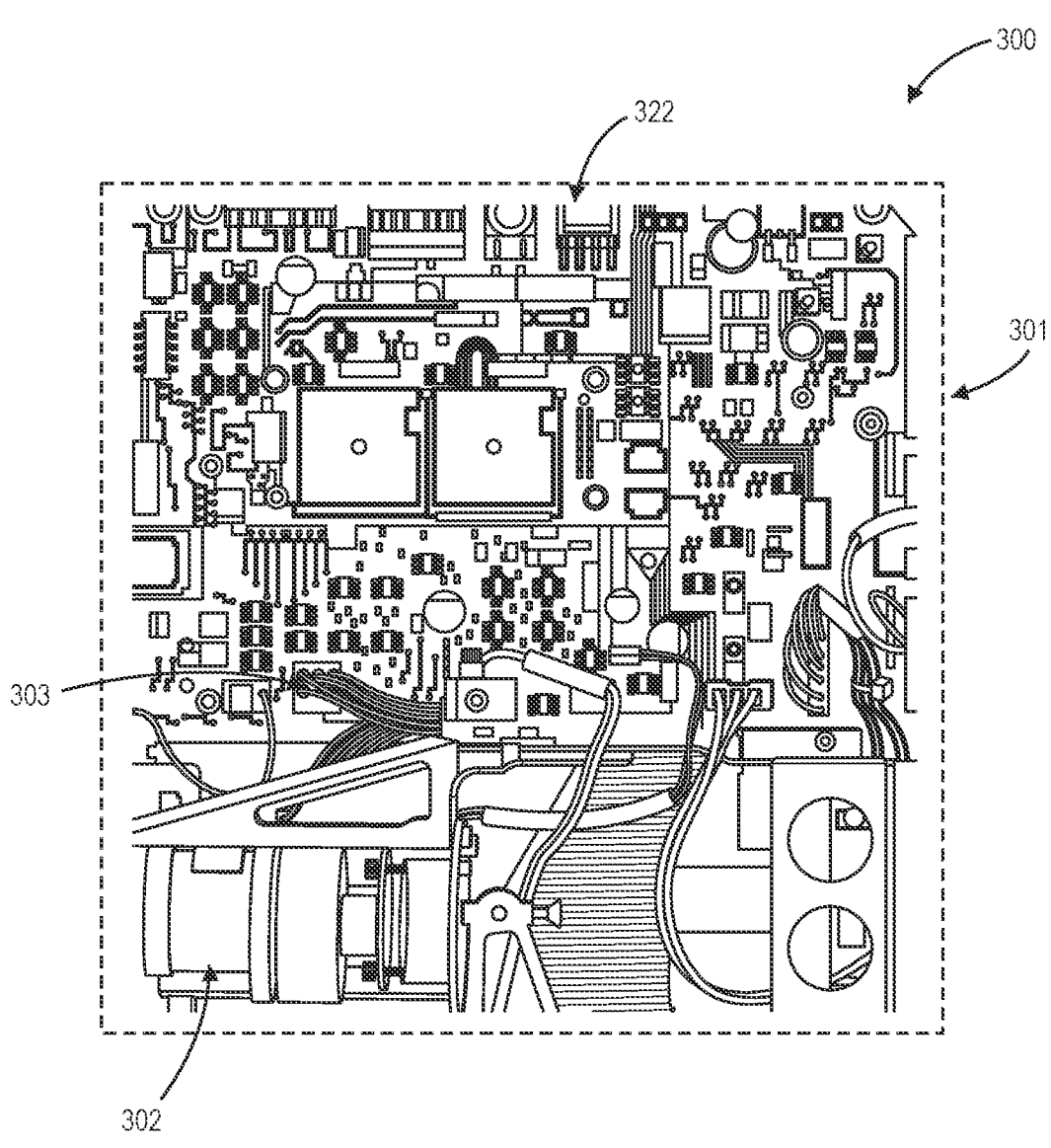
FIG. 3 is a schematic, plan view diagram of a portion of an example system including a motor to be tested by a portable motor testing device, in accordance with implementations of the present disclosure.

FIG. 3 is a schematic, plan view diagram 300 of a portion of an example system including a motor to be tested by a portable motor testing device, in accordance with implementations of the present disclosure.

As shown in FIG. 3, an example machinery, equipment, or system 301 may comprise a microcontroller 322 and/or motor driver board that is coupled to a motor 302 via a motor connector 303 and associated wire or cable. For example, the machinery, equipment, or system 301 may comprise a portion of a material handling equipment, a sortation system, a conveyance machinery, a robotic drive unit, a shuttle, another robotic or automated vehicle, or other type of robotic, automated, semi-automated, or electromechanical system or device.

During nominal operation, the microcontroller 322 and/or motor driver board may send motor inputs or commands to the motor 302 via the connector 303 and associated wire or cable in order to cause operation of the motor 302 as desired within the example machinery, equipment, or system 301. If there is a fault or failure of a portion of the example machinery, equipment, or system 301 affecting operation of the motor 302, conventional testing processes may require complete disassembly or removal of the motor 302 from the system 301. In addition, disassembly or removal of the motor 302 may also require disassembly or removal of various other portions, assemblies, or subassemblies of the system 301, e.g., removal of a shuttle from a sortation system in order to disassemble a motor from within the shuttle. Then, the disassembled motor 302 may be transported to a conventional large, fixed, or dedicated testing workstation to test operational characteristics of the motor 302.

In example embodiments described herein, the portable motor testing devices described herein may be used to test or diagnose faults or failures of motors without requiring disassembly or removal of such motors from the machinery, equipment, or systems within which the motors are designed to operate. For example, referring again to FIG. 3, in order to test or diagnose the motor 302 while assembled within the system 301, only limited or no disassembly may be required. In some examples, one or more access panels may be simply opened or removed to allow access to the motor 302 to be tested and associated motor connector 303.

Responsive to enabling access to the motor 302 and motor connector 303, the motor connector 303 may be disconnected or decoupled from the microcontroller 322 and/or motor driver board associated with the system 301. A portable motor testing device may comprise a replaceable wire or cable that is coupled to the testing device via a first connector at a first end. Then, the motor connector 303 may be connected or coupled with a corresponding or mating second connector at a second end of the replaceable wire, such that the motor 302 may be operatively coupled to the portable motor testing device. As a result, the motor 302 may no longer be operatively electrically connected to the microcontroller 322 and/or motor driver board of the system 301; however, the motor 302 may remain physically assembled or installed within the system 301.

While the motor 302 is coupled with the portable motor testing device via the motor connector 303 and connectors of the replaceable wire associated with the testing device, a microcontroller and/or motor driver board associated with the testing device may initiate and perform one or more motor testing processes or algorithms to test or diagnose faults or failures of the motor 302.

Moreover, because the motor 302 remains physically assembled or installed within the system 301, motor testing processes or algorithms that may be commanded or instructed to the motor 302 may be performed with substantially actual use or operating conditions or environment. For example, if the system 301 is a shuttle or robotic drive unit of a sortation system, the motor 302 may be operatively coupled to one or more wheels, rollers, or other movement elements via various drivetrains, geartrains, or other movement transfer systems. As a result, the motor inputs or commands instructed to the motor 302 as part of the testing processes or algorithms may cause actual movement of the one or more wheels, rollers, or other movement elements via various drivetrains, geartrains, or other movement transfer systems, i.e., substantially actual use or operating conditions or environment. Generally, motor testing processes or algorithms that are performed in the context of substantially actual use or operating conditions or environment may be more accurate and reliable than testing of motors in isolation, e.g., disconnected or decoupled from any components, elements, loads, resistance, or other aspects associated with actual use or operating conditions or environment.

Furthermore, motor testing using a microcontroller and/or motor driver board associated with the testing device may prevent inadvertent or additional damage to the microcontroller 322, motor driver board, and/or other electrical components associated with the system 301. In this manner, further downtime, costs, and labor associated with testing, removal, and/or replacement of other components of a system 301 as a result of faults or damage that may propagate from or be inadvertently caused by motor testing processes may be avoided or mitigated.

In other example embodiments, the portable motor testing devices described herein may also be used to test motors that have previously been disassembled or removed from various machinery, equipment, or systems, e.g., loose or uninstalled motors. As described herein, the portable motor testing device may comprise a replaceable wire or cable that is coupled to the testing device via a first connector at a first end. Then, a motor connector of the loose motor may be connected or coupled with a corresponding or mating second connector at a second end of the replaceable wire, such that the loose motor may be operatively coupled to the portable motor testing device.

While the loose motor is coupled with the portable motor testing device via an associated motor connector and connectors of the replaceable wire associated with the testing device, a microcontroller and/or motor driver board associated with the testing device may initiate and perform one or more motor testing processes or algorithms to test or diagnose faults or failures of the loose motor. In this manner, the portable motor testing device may be used to quickly, accurately, and reliably test various types of loose motors that have been removed or uninstalled from their respective systems, such that health or functionality of such loose motors may be determined. As a result, loose motors having good health or functionality may be maintained in inventory and/or utilized within appropriate systems, whereas loose motors having poor health or functionality may be repaired, refurbished, or discarded, thereby removing uncertainty that may often be associated with health or functionality of loose motors that have been previously removed or disassembled from various machinery, equipment, or other systems.

In further example embodiments, the portable motor testing devices and testing algorithms described herein may be used to test and diagnose faults or failures of closed box motors, i.e., motors for which internal, structural, or operational characteristics are generally unknown. For example, closed box motors may comprise various unknown motor parameters or characteristics, such as internal composition, phasing, windings, poles, brushes, electrical pin configurations, resistance, other electrical characteristics, or various other internal, structural, or operational characteristics. Even without full, complete, or substantially any knowledge of such characteristics of closed box motors, the portable motor testing devices described herein may be used to test and diagnose health or functionality of such motors.

For example, a number of closed box motors of a same or similar type having known good health or functionality may be tested using the portable motor testing devices described herein. Various motor inputs or commands may be provided or commanded to the closed box motors, and various motor outputs or parameters, responsive to the motor inputs, may be detected, measured, and/or processed. In some examples, the motor inputs or commands may be based on actual inputs or commands that are transmitted to the closed box motors when used as part of machinery, equipment, or systems within which the closed box motors are designed to operate. In other examples, the motor inputs or commands may be determined in order to test various characteristics or operational limits related to the closed box motors. Then, responsive to the motor inputs or commands, the portable motor testing devices may detect, measure, and/or process the motor outputs or parameters of the known healthy, closed box motors. Because the closed box motors are known to have good health or functionality, the processed motor outputs or parameters may be used to generate known or expected values or ranges of motor outputs or parameters during nominal operation, responsive to respective motor inputs or commands.

Then, closed box motors of a same or similar type having unknown or uncertain health or functionality may be tested, and their motor outputs or parameters, responsive to motor inputs, may be detected, processed, and then compared with the known or expected values or ranges of motor outputs or parameters during nominal operation. If the motor outputs or parameters of unknown closed box motors are within one or more threshold values of the known or expected values or ranges of motor outputs or parameters during nominal operation, the unknown closed box motors may be determined to be healthy and/or fully functional. Alternatively, if the motor outputs or parameters of unknown closed box motors are outside one or more threshold values of the known or expected values or ranges of motor outputs or parameters during nominal operation, the unknown closed box motors may be determined to be unhealthy and/or not fully functional. As a result, the portable motor testing devices and testing algorithms described herein may be used to test and diagnose health and functionality of various types of closed box motors, even in the absence of full, complete, or substantially any knowledge of internal, structural, or operational characteristics of such closed box motors.

Furthermore, based on testing and understanding of motor inputs and corresponding motor outputs for closed box motors, various parameter estimation, model-based or data-based design or analysis, or other modeling or identification techniques may be used to estimate or approximate various internal, structural, or operational characteristics of such closed box motors. As described herein, dedicated circuitry or electronic components configured to implement or execute the parameter estimation, model-based or data-based design or analysis, or other algorithms or techniques may be included as part of the microcontroller 220 and/or the motor driver board 222, and/or within the portable motor testing device 105 and in communication with the microcontroller 220 and/or the motor driver board 222.

For example, various internal, structural, or operational characteristics of some types of motors may be known, in combination with associated motor inputs and corresponding motor outputs for such known motors. By aggregating such data related to various different types of motors with known internal, structural, or operational characteristics, known motor inputs, and corresponding known motor outputs, parameters or characteristics of closed box motors may be estimated or approximated. Various parameters or characteristics of closed box motors, such as impedance, resistance, inductance, or others, may be estimated or approximated based on motor input, outputs, or other data that is detected or measured during various comprehensive testing procedures.

In some specific examples, various parameters for brushless DC motors may be estimated or approximated using parameter estimation techniques, including three phase calibration, phase resistance, Hall sensor calibration, back EMF constants, rotor inertia, quadrature encoder calibration, pole pairs estimation, or other parameters. In addition, various parameters for brushed DC motors may be estimated or approximated using parameter estimation techniques, including resistance, inductance, back EMF constants, or other parameters. Further, various parameters for servo motors may be estimated or approximated using parameter estimation techniques, including phase wires calibration, armature resistance, motor torque inertia, gear ratios, or other parameters.

In addition, model-based or data-based design or analysis algorithms or techniques may generate, receive, and/or leverage models of motor behavior, e.g., based on physics models of known motors and their associated behaviors, parameters, or characteristics. Then, based at least in part on estimated parameters or characteristics of closed box motors, which may be estimated based on motor input, outputs, and other data detected or measured during comprehensive testing procedures of closed box motors, model-based or data-based analysis of the closed box motors may be performed to generate or approximate models of the closed box motors, which may further facilitate pinpointing potential faults of such motors even without full knowledge of internal or structural characteristics of the closed box motors. In this manner, a greater understanding of closed box motors may be achieved, in order to further facilitate and refine motor testing processes and/or algorithms that may be applied to such closed box motors in order to determine their health and/or functionality.

In some example embodiments of motor testing processes, one or more motors having known good health or functionality may be tested using the portable motor testing devices described herein. Based on data received and processed during the testing processes, nominal operational parameters of the known good motors may be estimated. Further, based on the nominal operational parameters, data-based models of the known good motors may be generated or created. In addition, various motor testing processes or algorithms may be generated or tuned based on the data-based models of the known good motors. For example, motor testing or control profiles may be adjusted or tuned based on operational parameters of the known good motors, in order to effectively test motors of specific types, for specific usage profiles, and/or in specific applications.

Then, one or more closed box motors of a similar type as the known good motors may be tested using the portable motor testing devices described herein. Various data of the closed box motors may be measured, received, and processed during the testing processes, and the determined operational parameters of the closed box motors may be compared with the nominal operational parameters and data-based models of the known good motors. Deviations or differences between the measured or determined operational parameters of the closed box motors relative to the nominal operational parameters and data-based models of the known good motors may indicate one or more faults associated with the closed box motors. Further, one or more outputs, reports, or other data or information may be provided related to the results of the testing of closed box motors, e.g., pass, fail, parameters or outputs associated with faults, identified trends over time, recommended corrective actions, and/or other outputs.

FIG. 4 is a flow diagram illustrating an example motor testing process 400, in accordance with implementations of the present disclosure.

The process 400 may begin by determining whether to test a motor while assembled in a system, as at 402. For example, it may be determined whether a motor to be tested may be made accessible while still assembled or installed in machinery, equipment, or system within which it is designed to operate. In some examples, the various machinery, equipment, or systems may comprise various material handling equipment, sortation systems, conveyance machinery, robotic drive units, shuttles, other robotic or automated vehicles, or other types of robotic, automated, semi-automated, or electromechanical systems or devices. In other examples, various other types of machinery, equipment, or systems having one or more motors may be tested using the processes described herein.

If it is determined to test the motor while assembled in a system, the process 400 may continue by enabling access to the motor assembled in the system, as at 404. For example, one or more minimal actions may be performed or instructed to enable access to the motor while remaining assembled in a system, e.g., removing or opening one or more access panels, positioning the motor in a particular orientation, or other actions. In examples related to shuttles or robotic drive units within sortation systems, the shuttles may be instructed to move to an accessible portion of the sortation system, e.g., a maintenance location, a sideline portion, or other accessible region. Then, one or more minimal actions may be performed or instructed to enable access to a motor within a shuttle, e.g., positioning or rotating the shuttle to an access position or orientation, removing or opening one or more access panels, or other actions.

The process 400 may then proceed by disconnecting the motor from a motor driver of the system via the motor driver cable, as at 406. For example, within the system in which the motor is designed to operate, the motor may be connected or coupled to a microcontroller and/or motor driver board via a motor driver cable during nominal operation. After enabling access to the motor, the motor driver cable may be disconnected from the microcontroller and/or motor driver board, thereby enabling subsequent connection or coupling to a portable motor testing device as described herein.

Returning to step 402, if it is determined not to test the motor while assembled in a system, the process 400 may continue to disassemble the motor from the system, as at 407. For example, the motor may be disassembled, removed, or uninstalled from the machinery, equipment, or system, including disconnecting a motor driver cable from the microcontroller and/or motor driver board of the system. In some examples, disassembly of the motor may also require removal or disassembly of a portion, assembly, or subassembly of the system prior to gaining access to remove or uninstall the motor from the portion, assembly, or subassembly of the system, e.g., removal of a shuttle from a sortation system prior to disassembly of a motor from the shuttle.

Then, the process 400 may proceed to connect the motor to a motor driver of the testing device using a replaceable cable, as at 408. For example, whether the motor remains installed in the system as at 404 and 406, or whether the motor is disassembled from the system as at 407, the motor driver cable that has been disconnected from the microcontroller and/or motor driver board of the system may then be coupled to a microcontroller and/or motor driver board of the portable motor testing device via a replaceable cable. As described herein, the replaceable cable may be selected from a plurality of replaceable cables based on identification or selection of a corresponding second connector at a second end of the replaceable cable that mates with a connector of the motor driver cable of the motor. The first connector at a first end of the replaceable cable may be coupled with the portable motor testing device via corresponding connectors. In addition, the portable motor testing device may include an internal power supply, or may be connected to an external power supply via a power cable and associated connectors.

The process 400 may then continue with executing a motor testing algorithm, as at 410. For example, one or more motor testing processes or algorithms may be performed, instructed, or commanded to test or diagnose the motor for various faults or failures. In some examples, the motor testing algorithms may comprise various commanded rotational speeds, accelerations, rotational directions, ramp-up times, ramp-down times, dwell or hold times, or other types of motor inputs or commands. Some motor testing algorithms may be based on or designed to emulate actual usage profiles or operating conditions of motors within systems, e.g., operating speeds, accelerations, dwell or hold times, etc. Other motor testing algorithms may be designed to test various motor characteristics, operational limits, particular functions, or other aspects or parameters of the motors, e.g., minimum or maximum speeds, minimum or maximum accelerations, etc. Further details of example motor testing algorithms are described herein at least with respect to FIGS. 5 and 6.

The process 400 may proceed with determining whether a stop button is pressed, as at 412. For example, during performance of one or more motor testing processes or algorithms, actuation of the stop test button may be monitored. In some examples in which the motor is tested while still assembled or installed in a system, the stop test button may be pressed or actuated if there are problems or issues associated with portions of the system that may be driven by the motor during the testing, such as belts, gears, drivetrains, bearings, wheels, or other components, because such external issues related to components of the system may adversely affect safe and reliable testing of the motor by the portable motor testing device and motor testing algorithm. In other examples, the stop test button may be pressed or actuated to mitigate or prevent propagation of issues or problems associated with the motor, the testing device, the testing process or algorithm, the external environment, or other aspects. If an input or command associated with pressing or actuation of the stop test button is received, the motor testing algorithm may terminate and the process may end, as at 424.

If, however, an input or command associated with pressing or actuation of the stop test button is not received, it may be determined whether the motor testing algorithm is complete, as at 414. For example, in the absence of an input to terminate the testing, performance of the motor testing algorithm may continue until completion. If performance of the motor testing algorithm is not yet complete, the process 400 may return to step 410 to continue execution of the motor testing algorithm.

If, however, performance of the motor testing algorithm is complete, the process 400 may continue by determining whether the motor passed the test, as at 416. For example, the motor testing algorithm may provide various motor inputs or commands to the motor under test, and one or more motor outputs or parameters may be detected or measured during performance of the motor testing algorithm. In addition, the microcontroller and/or motor driver board of the portable motor testing device may receive, process, and/or analyze the motor outputs or parameters to determine whether the motor is healthy and functional, or whether the motor is experiencing one or more faults or failures. As described herein, the detected, measured, or processed motor parameters may be compared with one or more known or expected values or ranges of operational parameters associated with known healthy or functional motors of the same or similar type, in order to determine health and functionality of the motor under test. In some examples, the comparison may comprise one or more determinations related to failure conditions that may be based on the known or expected values or ranges of operational parameters associated with known healthy or functional motors of the same or similar type, as further described herein at least with respect to FIGS. 5 and 6.

In some example embodiments, the determination of whether the motor has passed the test may be continuously or intermittently made during performance of the motor testing algorithm. For example, if it is determined that the motor under test has experienced a fault or failure during a portion of the motor testing algorithm, the motor testing algorithm may be terminated before completion of the entire testing algorithm, and the process 400 may proceed to step 418 as described herein.

If it is determined that the motor did not pass the test, then the process 400 may proceed by removing, replacing, or discarding the motor, as at 418. For example, the motor may be repaired or refurbished in order to try to correct any determined faults or failures. In addition, the motor may be removed or replaced relative to a machinery, equipment, or system within which the motor may be assembled or installed. Further, the motor may be removed, discarded, and/or returned to a manufacturer, if on-site repair is not possible or feasible. Then, the process 400 may end, as at 424.

If, however, it is determined that the motor passed the test, then the process 400 may continue to retain or store the motor, as at 420. For example, if the motor remains assembled within a system, the motor may be retained based on the determination that the motor is healthy and functional. In addition, the motor may be returned to service or operation within the system, which may be dependent upon successful completion of one or more additional checks or tests related to other components of the system. Alternatively, if the motor has been disassembled from a system, the motor may be maintained or stored within an inventory of an entity that operates the system, and the motor may be marked or labeled as a known healthy and functional motor that may be later used as needed.

The process 400 may proceed to test other components of the system, as at 422. For example, if the motor, or a portion, assembly, or subassembly including the motor, had previously indicated some type of fault or failure that precipitated the motor testing process described herein, one or more other components of the portion, assembly, or subassembly of the system, or other parts of the system, may be further tested upon determining that the motor is healthy and functional. Various other checks or testing may be performed to identify one or more causes of the indicated fault or failure that may be separate or independent from the motor under test. Then, the process 400 may end, as at 424. In further example embodiments, such checks or testing of other components of the portion, assembly, or subassembly of the system, or other parts of the system, may also be performed in cases in which the motor has been determined to exhibit a fault or failure, since other components of a system may also be experiencing one or more faults or failures in combination with those experienced by the motor under test.

In this manner, the motor testing process described herein may facilitate testing and diagnosing of faults or failures associated with motors, particularly for motors that may remain assembled or installed within various systems in which they are designed to operate. Further, the portable motor testing devices and motor testing algorithms may enable definitive and independent determinations of motor health and functionality, which may further facilitate identification and analysis of faults or failures associated with or caused by other components of a system, thereby improving root cause analysis of faults or failures with various types of machinery, equipment, or systems.

Figure 5:
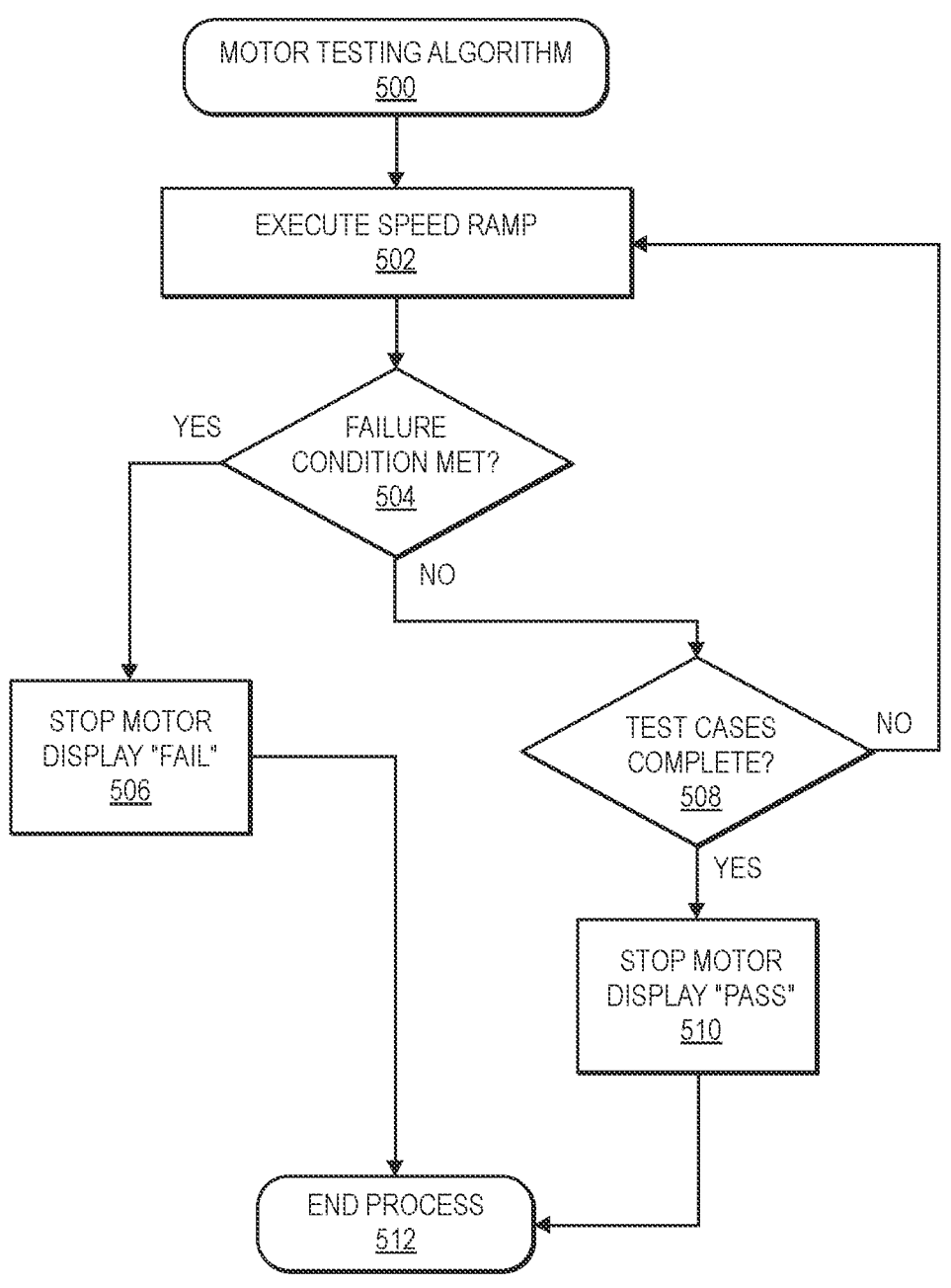
FIG. 5 is a flow diagram illustrating an example motor testing algorithm, in accordance with implementations of the present disclosure.

FIG. 5 is a flow diagram illustrating an example motor testing algorithm 500, in accordance with implementations of the present disclosure.

The process 500 may begin by executing a speed ramp, as at 502. For example, a first speed ramp of a plurality of speed ramps may be selected, instructed, and commanded to a motor under test. The plurality of speed ramps may comprise various combinations of commanded rotational speeds, accelerations, rotational directions, ramp-up times, ramp-down times, dwell or hold times, or other motor commands. Various motor testing algorithms may comprise various different combinations of motor commands and parameters, in order to test and diagnose faults or failures associated with different types of motors under test, different usage profiles, and/or different applications. Further, a microcontroller and/or motor driver board of a portable motor testing device may command or instruct execution of a speed ramp.

The process 500 may continue by determining whether a failure condition is met, as at 504. For example, during execution of a speed ramp and/or during dwell or hold times between speed ramps, one or more motor outputs or parameters may be detected, measured, and/or processed. The motor outputs may comprise various values such as current, voltage, rotational speed, torque, power consumption, temperature, or other motor outputs or parameters. In addition, the determined or processed motor outputs may be compared with expected nominal values or ranges associated with the executed speed ramp and known motors of a same or similar type. Further, a microcontroller and/or motor driver board of a portable motor testing device may command or instruct determination of whether a failure condition is met.

If it is determined that a failure condition is met, then the process 500 may proceed by stopping the motor and displaying a "Fail" message, as at 506. For example, the execution of speed ramps by the motor under test may be stopped or terminated responsive to a failure condition being met. In addition, various data or information may be presented via the display of the portable motor testing device, e.g., a "Fail" message and/or information, details, or error codes related to particular failure conditions being met. For example, a failure condition related to measured current may result in presentation of a first error code, a failure condition related to measured voltage may result in presentation of a second error code, a failure condition related to measured rotational speed may result in presentation of a third error code, etc. Moreover, data or information related to motor outputs or parameters during portions of the motor testing algorithm, including failure conditions, may be transmitted to other or remote computing resources for further processing and/or analysis. Further, a microcontroller and/or motor driver board of a portable motor testing device may command or instruct stopping of the motor under test, as well as causing presentation of data or information related to failure conditions. Then, the process 500 may end, as at 512.

If, however, it is determined that a failure condition is not met, then the process 500 may continue to determine whether test cases associated with a selected motor testing algorithm are complete, as at 508. For example, the selected motor testing algorithm may be designed or configured to test the particular motor under test, or motors of similar type. As a result, the selected motor testing algorithm may include a particular combination or sequence of speed ramps, test cases, and various other motor commands. If the test cases associated with the selected motor testing algorithm are not yet complete, the process 500 may return to step 502 to cause or instruct execution of a next speed ramp, test case, or portion of the combination or sequence associated with the selected motor testing algorithm.

If, however, the test cases associated with the selected motor testing algorithm are complete, the process 500 may proceed to stop the motor and display a "Pass" message, as at 510. For example, the execution of speed ramps by the motor under test may be stopped or terminated responsive to completion of all test cases, speed ramps, or all portions of the combination or sequence associated with the selected motor testing algorithm. In addition, various data or information may be presented via the display of the portable motor testing device, e.g., a "Pass" message and/or information or details related to completion of the motor testing algorithm. In some examples, additional data or information related to motor outputs or parameters during portions of the motor testing algorithm may be presented via the display, and/or transmitted to other or remote computing resources for further processing and/or analysis. Further, a microcontroller and/or motor driver board of a portable motor testing device may command or instruct stopping of the motor under test, as well as causing presentation of data or information related to successful completion of the motor testing algorithm. Then, the process 500 may end, as at 512.

Figure 6:
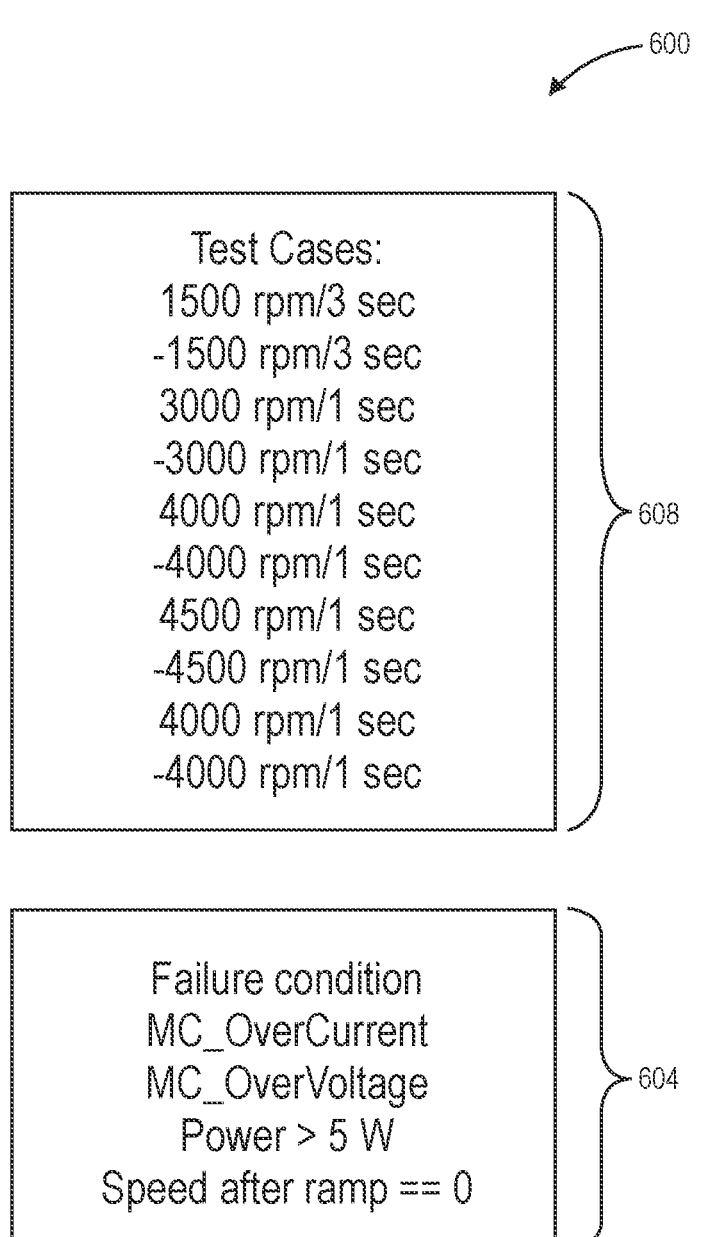
FIG. 6 is a schematic diagram illustrating example test cases and failure conditions associated with a motor testing algorithm, in accordance with implementations of the present disclosure.

FIG. 6 is a schematic diagram 600 illustrating example test cases and failure conditions associated with a motor testing algorithm, in accordance with implementations of the present disclosure.

As shown in FIG. 6, an example motor testing algorithm may include various combinations or sequences of test cases 608, as well as various failure conditions 604 associated with execution of the motor testing algorithm.

In the illustrated example, the plurality of test cases 608 may include various combinations or sequences of rotational speeds, e.g., approximately 1500 rpm (revolutions per minute), 3000 rpm, 4000 rpm, 4500 rpm, or other rotational speeds, various combinations or sequences of rotational directions, e.g., a positive or clockwise direction and a negative or counter-clockwise direction, and/or various combinations or sequences of ramp-up or ramp-down times, e.g., approximately 3 sec, 1 sec, or other time durations. In addition, the plurality of test cases 608 may include various combinations or sequences of dwell or hold times, e.g., time durations between adjacent speed ramps such as approximately 3 sec, 5 sec, 10 sec, or other time durations. Further, the plurality of test cases 608 may include various other combinations or sequences of other motor inputs or commands to facilitate testing of various types of motors.

Further, as shown in FIG. 6, the failure conditions 604 may include various conditions or thresholds that may be based on expected or nominal values or ranges of motor outputs or parameters associated with nominal operation during execution of a motor testing algorithm. For example, the failure conditions 604 may comprise various conditions or thresholds related to current, voltage, rotational speed, torque, power consumption, temperature, or other motor outputs or parameters during execution of a motor testing algorithm.

In one example, an example failure condition may comprise an overcurrent, e.g., a current value that is above or exceeds an expected or nominal value or range of current during execution of the motor testing algorithm. In another example, an example failure condition may comprise an undercurrent, e.g., a current value that is below or undershoots an expected or nominal value or range of current during execution of the motor testing algorithm.

In a further example, an example failure condition may comprise an overvoltage, e.g., a voltage value that is above or exceeds an expected or nominal value or range of voltage during execution of the motor testing algorithm. In a yet further example, an example failure condition may comprise an undervoltage, e.g., a voltage value that is below or undershoots an expected or nominal value or range of voltage during execution of the motor testing algorithm.

In a still further example, an example failure condition may comprise an overspeed condition, e.g., a rotational speed value that is above or exceeds an expected or nominal value or range of rotational speed during execution of the motor testing algorithm. In an additional example, an example failure condition may comprise an underspeed condition, e.g., a rotational speed value that is below or undershoots an expected or nominal value or range of rotational speed during execution of the motor testing algorithm.

In another example, an example failure condition may comprise excessive power consumption, e.g., a power consumption value that is above or exceeds an expected or nominal value or range of power consumption during execution of the motor testing algorithm. In a further example, an example failure condition may comprise excessive temperature condition, e.g., a motor temperature or motor driver board temperature value that is above or exceeds an expected or nominal value or range of temperature during execution of the motor testing algorithm.

Other example embodiments of motor testing algorithms may include test cases having other combinations or sequences of various motor inputs or commands. In addition, other example embodiments may include various other failure conditions based on various motor outputs or parameters that may be applied to different motor testing algorithms in order to determine whether a motor under test is experiencing one or more faults or failures.

It should be understood that, unless otherwise explicitly or implicitly indicated herein, any of the features, characteristics, alternatives or modifications described regarding a particular implementation herein may also be applied, used, or incorporated with any other implementation described herein, and that the drawings and detailed description of the present disclosure are intended to cover all modifications, equivalents and alternatives to the various implementations as defined by the appended claims. Moreover, with respect to the one or more methods or processes of the present disclosure described herein, including but not limited to the flow charts shown in FIGS. 4 and 5, orders in which such methods or processes are presented are not intended to be construed as any limitation on the claimed inventions, and any number of the method or process steps or boxes described herein can be omitted, reordered, or combined in any order and/or in parallel to implement the methods or processes described herein. Also, the drawings herein are not drawn to scale.

Conditional language, such as, among others, "can," "could," "might," or "may," unless specifically stated otherwise, or otherwise understood within the context as used, is generally intended to convey in a permissive manner that certain implementations could include, or have the potential to include, but do not mandate or require, certain features, elements and/or steps. In a similar manner, terms such as "include," "including" and "includes" are generally intended to mean "including, but not limited to." Thus, such conditional language is not generally intended to imply that features, elements and/or steps are in any way required for one or more implementations or that one or more implementations necessarily include logic for deciding, with or without user input or prompting, whether these features, elements and/or steps are included or are to be performed in any particular implementation.

The elements of a method, process, or algorithm described in connection with the implementations disclosed herein can be embodied directly in hardware, in a software module stored in one or more memory devices and executed by one or more processors, or in a combination of the two. A software module can reside in RAM, flash memory, ROM, EPROM, EEPROM, registers, a hard disk, a removable disk, a CD ROM, a DVD-ROM or any other form of non-transitory computer-readable storage medium, media, or physical computer storage known in the art. An example storage medium can be coupled to the processor such that the processor can read information from, and write information to, the storage medium. In the alternative, the storage medium can be integral to the processor. The storage medium can be volatile or nonvolatile. The processor and the storage medium can reside in an ASIC. The ASIC can reside in a user terminal. In the alternative, the processor and the storage medium can reside as discrete components in a user terminal.

Disjunctive language such as the phrase "at least one of X, Y, or Z," or "at least one of X, Y and Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain implementations require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

Language of degree used herein, such as the terms "about," "approximately," "generally," "nearly" or "substantially" as used herein, represent a value, amount, or characteristic close to the stated value, amount, or characteristic that still performs a desired function or achieves a desired result. For example, the terms "about," "approximately," "generally," "nearly" or "substantially" may refer to an amount that is within less than 10% of, within less than 5% of, within less than 1% of, within less than 0.1% of, and within less than 0.01% of the stated amount.

Although the invention has been described and illustrated with respect to illustrative implementations thereof, the foregoing and various other additions and omissions may be made therein and thereto without departing from the spirit and scope of the present disclosure.

What is claimed is:

1. A portable motor testing device, comprising:
a handheld housing comprising a user interface, a microcontroller, and a motor driver board;
a power supply operatively coupled to the user interface, the microcontroller, and the motor driver board; and
a replaceable cable operatively coupled between the motor driver board and a motor under test;
wherein the microcontroller is configured to at least:
instruct, via the motor driver board, the motor under test to perform a plurality of speed ramps;
monitor a plurality of failure conditions associated with the motor under test during the plurality of speed ramps; and responsive to a failure condition being met:
instruct, via the motor driver board, stopping of the plurality of speed ramps; and
cause, via the user interface, presentation of information related to the failure condition being met.
2. The portable motor testing device of claim 1, wherein the microcontroller is further configured to at least:
responsive to a failure condition not being met:
instruct, via the motor driver board, stopping of the plurality of speed ramps; and
cause, via the user interface, presentation of information related to the failure condition not being met.
3. The portable motor testing device of claim 1, wherein the user interface further comprises:
a power switch, a start test button, a stop test button, and a display; and
wherein the information related to the failure condition being met is presented via the display.
4. The portable motor testing device of claim 1, wherein the replaceable cable further comprises:
a first connector at a first end that is configured to couple to a motor driver connector associated with the motor driver board of the handheld housing; and
a second connector at a second end that is configured to couple to a motor connector associated with the motor under test.
5. The portable motor testing device of claim 1, wherein the plurality of speed ramps comprise a plurality of different rotational speeds and a plurality of different time durations; and
wherein the plurality of failure conditions comprise at least one of:
a current value relative to a nominal current range;
a voltage value relative to a nominal voltage range;
a rotational speed value relative to a nominal rotational speed range;
a power consumption value relative to a nominal power consumption range; or
a temperature value relative to a nominal temperature range.
6. A portable device, comprising:
a handheld unit comprising a user interface and a microcontroller;
a power supply configured to operatively couple to the handheld unit; and
a replaceable cable configured to operatively couple between the microcontroller and a motor under test;
wherein the portable device is configured to determine a health of the motor under test; and
wherein the microcontroller is configured to at least:
instruct the motor under test to perform a plurality of speed ramps over time; and
monitor a plurality of failure conditions associated with the motor under test during the plurality of speed ramps over time.
7. The portable device of claim 6, wherein the user interface further comprises:
a power switch, a start test button, a stop test button, and a display.
8. The portable device of claim 6, further comprising:
a motor driver board configured to transmit instructions from the microcontroller to the motor under test via the replaceable cable.
9. The portable device of claim 8, wherein the replaceable cable further comprises:

a first connector at a first end that is configured to couple to a motor driver connector associated with the motor driver board of the handheld unit; and a second connector at a second end that is configured to couple to a motor connector associated with the motor under test.

10. The portable device of claim 9, wherein the replaceable cable comprises one of a plurality of replaceable cables; and wherein the plurality of replaceable cables comprise different respective second connectors that are configured to couple to respective motor connectors associated with respective motors under test.

11. The portable device of claim 9, wherein the second connector of the replaceable cable is configured to couple to the motor connector associated with the motor under test while the motor under test remains assembled within at least one of a machinery, equipment, or system.

12. The portable device of claim 11, wherein the at least one of the machinery, equipment, or system comprises at least one of a robot, drive unit, or shuttle operating within an item sortation system.

13. The portable device of claim 6, wherein the microcontroller is further configured to at least:

responsive to a first failure condition being met:

instruct, via the motor driver board, stopping of the plurality of speed ramps; and cause, via the user interface, presentation of information related to the first failure condition.

14. The portable device of claim 6, wherein the plurality of failure conditions are monitored by comparing at least one operational parameter of the motor under test with at least one of a data-based model or estimated operational parameters associated with a plurality of known functional motors of a same type as the motor under test.

15. A method, comprising:

instructing, by a microcontroller comprised within a handheld unit, a motor under test to perform a plurality of speed ramps over time, wherein instructions are transmitted to the motor under test via a replaceable cable that is coupled between the handheld unit and the motor under test;

monitoring a plurality of failure conditions associated with the motor under test during the plurality of speed ramps over time; and responsive to a first failure condition being met:

instructing, by the microcontroller, stopping of the plurality of speed ramps; and causing, via a user interface of the handheld unit, presentation of information related to the first failure condition.

16. The method of claim 15, further comprising:

determining the plurality of speed ramps over time based on operational characteristics of the motor under test during operation within at least one of a machinery, equipment, or system;

wherein the plurality of speed ramps over time comprise at least a first speed ramp having a first rotational speed that is different than a second rotational speed of a second speed ramp.

17. The method of claim 15, further comprising:

instructing, by the microcontroller comprised within the handheld unit, a plurality of known functional motors corresponding to the motor under test to perform the plurality of speed ramps over time;

measuring a plurality of parameters of the plurality of known functional motors during the plurality of speed ramps over time; and determining the plurality of failure conditions associated with the motor under test based at least in part on the plurality of parameters of the plurality of known functional motors corresponding to the motor under test.

18. The method of claim 17, further comprising:

generating a data-based model associated with the plurality of known functional motors based on the plurality of parameters;

wherein the plurality of parameters comprise nominal operational parameters that are estimated based on data received from the plurality of known functional motors during performance of the plurality of speed ramps over time.

19. The method of claim 18, wherein the motor under test comprises a closed box motor of a same type as the plurality of known functional motors; and wherein determining the plurality of failure conditions associated with the motor under test further comprises:

comparing at least one operational parameter of the motor under test with at least one of the data-based model or the nominal operational parameters of the plurality of known functional motors.

* * * * *